(12) United States Patent
Yoshida et al.

(10) Patent No.: US 11,276,804 B2
(45) Date of Patent: Mar. 15, 2022

(54) LIGHT EMITTING STRUCTURE AND SOLAR PHOTOVOLTAIC POWER GENERATION SYSTEM

(71) Applicant: SEKISUI CHEMICAL CO., LTD., Osaka (JP)

(72) Inventors: Shougo Yoshida, Limburg (NL); Yuusuke Oota, Koka (JP); Yasuyuki Izu, Limburg (NL); Daizou Ii, Koka (JP); Masaki Matsudou, Koka (JP); Kinryou Chou, Kusatsu (JP); Daisuke Nakajima, Koka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 70 days.

(21) Appl. No.: 16/650,467

(22) PCT Filed: Sep. 27, 2018

(86) PCT No.: PCT/JP2018/036138
§ 371 (c)(1),
(2) Date: Mar. 25, 2020

(87) PCT Pub. No.: WO2019/065921
PCT Pub. Date: Apr. 4, 2019

(65) Prior Publication Data
US 2020/0243724 A1    Jul. 30, 2020

(30) Foreign Application Priority Data
Sep. 29, 2017 (JP) .............................. JP2017-192255

(51) Int. Cl.
*H01L 33/00* (2010.01)
*H01L 33/50* (2010.01)
(Continued)

(52) U.S. Cl.
CPC ........ *H01L 33/502* (2013.01); *H01L 31/0547* (2014.12); *H01L 33/44* (2013.01)

(58) Field of Classification Search
CPC combination set(s) only.
See application file for complete search history.

(56) References Cited

U.S. PATENT DOCUMENTS

| | | | |
|---|---|---|---|
| 2002/0113243 A1* | 8/2002 | Kikawa | H01S 5/028 257/98 |
| 2012/0024345 A1 | 2/2012 | Reisfeld et al. | |

(Continued)

FOREIGN PATENT DOCUMENTS

| | | |
|---|---|---|
| CN | 101728446 | 6/2010 |
| CN | 102239570 | 11/2011 |

(Continued)

OTHER PUBLICATIONS

International Search Report (ISR) dated Oct. 30, 2018 in International (PCT) Application No. PCT/JP208/036138.

(Continued)

*Primary Examiner* — Niki H Nguyen
(74) *Attorney, Agent, or Firm* — Wenderoth, Lind & Ponack, L.L.P.

(57) ABSTRACT

The light emitting structure of the present invention includes a sheet-shaped structure which absorbs excitation light and emits light with wavelength conversion and which has a maximum emission wavelength of 400 nm or more; and an antireflection material provided on a side surface of the sheet-shaped structure.

11 Claims, 2 Drawing Sheets

(51) Int. Cl.
  *H01L 31/054* (2014.01)
  *H01L 33/44* (2010.01)

(56) References Cited

U.S. PATENT DOCUMENTS

| | | | |
|---|---|---|---|
| 2013/0087193 | A1 | 4/2013 | Yui et al. |
| 2015/0103226 | A1* | 4/2015 | Takahashi .............. G02B 1/118 |
| | | | 348/335 |
| 2017/0341346 | A1* | 11/2017 | McDaniel ............... B32B 17/08 |

FOREIGN PATENT DOCUMENTS

| | | |
|---|---|---|
| CN | 102986036 | 3/2013 |
| CN | 204633696 | 9/2015 |
| JP | 2007-218540 | 8/2007 |
| JP | 2015-99807 | 5/2015 |
| JP | 2016-122748 | 7/2016 |
| WO | 2009/011188 | 1/2009 |
| WO | 2015/047084 | 4/2015 |
| WO | 2015/119124 | 8/2015 |

OTHER PUBLICATIONS

Official Action dated Sep. 18, 2021 in corresponding Chinese Patent Application No. 201880063262.9, with English Translation, 15 pages.

* cited by examiner

LIGHT EMITTING STRUCTURE AND SOLAR PHOTOVOLTAIC POWER GENERATION SYSTEM

TECHNICAL FIELD

The present invention relates to a light emitting structure used for solar power generation or the like in windows and to a solar power system.

BACKGROUND ART

Since it is difficult to secure enough space for installing solar panels in a comparatively high construction such as a building, and energy creation is not sufficient, such an approach that solar cells are mounted on windows has been put to practical use. Specifically, a system in which a solar cell module is disposed in an intermediate layer of laminated glass and a system in which a solar cell module is disposed between plates of glass of double glazing are known. However, such a solar cell module generally has poor transparency, and the solar cell module often impairs visibility. Further, highly transparent organic solar cells are also in practical use, but have the problem that they are not durable.

To address the above problems, disposing power generation cells in a peripheral area, such as a window frame, of a window has been studied. For example, a solar radiation conversion device which contains, in a transparent member such as glass, a wavelength conversion material for converting ultraviolet light, visible light, or infrared light into near infrared light and collects the light that has been converted by the wavelength conversion material onto a side surface of glass by reflecting inside the transparent member so as to generate electricity has been developed (see PTL 1, for example).

CITATION LIST

Patent Literature

PTL 1: WO 2015/047084 A1

SUMMARY OF INVENTION

Technical Problem

However, in the solar radiation conversion device disclosed in PTL 1, the light converted into near-infrared light is not sufficiently collected into power generation cells, resulting in insufficient power generation efficiency.

The present invention has been devised in view of the circumstances described above, and an object of the present invention is to provide a light emitting structure capable of allowing light that is incident from one surface of a sheet-shaped structure and is converted into high-wavelength light such as near-infrared light therein to efficiently enter a power generation cell or the like provided on the outer side of a side surface of the sheet-shaped structure.

Solution to Problem

As a result of diligent studies, the inventors found that the aforementioned problem can be solved by providing an antireflection material on a side surface of a sheet-shaped structure while adjusting the maximum emission wavelength of the sheet-shaped structure to a predetermined wavelength or more, so that the present invention described below has been completed.

That is, the present invention provides [1] to [12] below.

[1] A light emitting structure comprising: a sheet-shaped structure which absorbs excitation light and emits light with wavelength conversion and which has a maximum emission wavelength of 400 nm or more; and an antireflection material provided on a side surface of the sheet-shaped structure.

[2] The light emitting structure according to [1] above, wherein the sheet-shaped structure comprises one or more layers, at least one of the layers is a substrate selected from the group consisting of an inorganic glass plate and a resin plate, and the substrate emits light, or a layer other than the substrate emits light.

[3] The light emitting structure according to [1] above, wherein the sheet-shaped structure comprises: a substrate that is any one of an inorganic glass and a resin plate; and a sheet-shaped member provided on at least one surface side of the substrate, wherein the sheet-shaped member absorbs excitation light and emits light with wavelength conversion, and has a maximum emission wavelength of 400 nm or more.

[4] The light emitting structure according to [3] above, wherein the sheet-shaped member is a light emitting layer comprising a resin and the wavelength conversion material dispersed in the resin.

[5] The light emitting structure according to [3] above, wherein the sheet-shaped member is composed of a coating formed on a surface of the substrate or is constituted by forming a coating on at least one surface of a base film, and the coating comprises a wavelength conversion material.

[6] The light emitting structure according to any one of [3] to [5] above, wherein the sheet-shaped structure comprises two substrates, and the sheet-shaped member is disposed between the two substrates.

[7] The light emitting structure according to any one of [1] to [6] above, wherein a visible light transmittance of the antireflection material is 70% or more.

[8] The light emitting structure according to any one of [1] to [7] above, wherein a maximum emission wavelength emitted from the sheet-shaped structure is 780 to 1300 nm.

[9] The light emitting structure according to any one of [1] to [8] above, wherein a maximum excitation wavelength absorbed by the sheet-shaped structure is 400 nm or less.

[10] The light emitting structure according to any one of [1] to [9] above, wherein the antireflection material has a moth-eye structure.

[11] The light emitting structure according to any one of [1] to [10] above, wherein the sheet-shaped structure comprises a substrate selected from the group consisting of an inorganic glass plate and a resin plate, and the antireflection material is an antireflection film having a refractive index lower than the refractive index of the substrate.

[12] A solar cell system comprising: the light emitting structure according to any one of [1] to [11] above; and a power generation cell provided outside the antireflection material on the side surface of the light emitting structure.

Advantageous Effects of Invention

The present invention provides a light emitting structure capable of allowing light that is incident from one surface of a sheet-shaped structure and is converted into comparatively high-wavelength light therein to efficiently enter a power generation cell or the like provided on the outer side of a side surface of the sheet-shaped structure.

DESCRIPTION OF EMBODIMENTS

Figure 1:
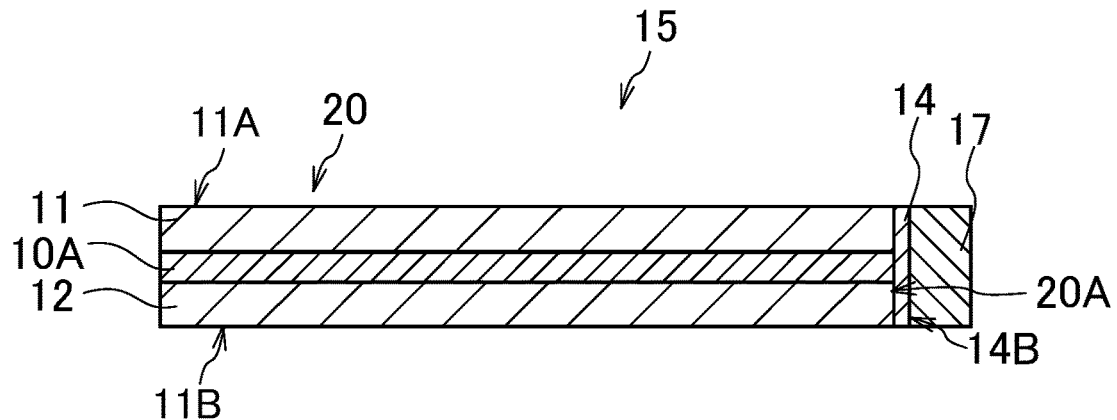
FIG. 1 is a schematic sectional view showing an embodiment of the solar cell system of the present invention.

Hereinafter, the present invention will be described in detail by referring to embodiments.

<Light Emitting Structure>

The light emitting structure of the present invention includes a sheet-shaped structure which absorbs excitation light and emits light with wavelength conversion and which has a maximum emission wavelength of 400 nm or more, and an antireflection material provided on a side surface of the sheet-shaped structure.

The light emitting structure of the present invention is such a structure, in which light such as sunlight is incident from one surface of the sheet-shaped structure, and the wavelength of at least part of the incident light is converted by the sheet-shaped structure so as to emit the converted light therefrom.

In the present invention, because the antireflection material is provided on the side surface of the sheet-shaped structure, the structure prevents light that is emitted by the sheet-shaped structure and guided to the side surface while being reflected inside the sheet-shaped structure from being reflected by the side surface. Therefore, reflection loss on the side surface of the sheet-shaped structure is reduced, and light emitted by the sheet-shaped structure can be efficiently emitted from the side surface of the light emitting structure.

[Sheet-Shaped Structure]

The sheet-shaped structure used in the present invention has a maximum emission wavelength of 400 nm or more, as described above. When the maximum emission wavelength is less than 400 nm, long-wavelength light cannot be sufficiently emitted, so that a power generation cell cannot generate power with high power generation efficiency. The maximum emission wavelength in the sheet-shaped structure is preferably 500 nm or more, more preferably 700 nm or more, further preferably 780 nm or more. When the maximum emission wavelength is 700 nm or more, near-infrared light is emitted by the sheet-shaped structure, and therefore the power generation efficiency in the power generation cell can be further enhanced.

The maximum emission wavelength in the sheet-shaped structure is preferably 1400 nm or less, more preferably 1300 nm or less, to achieve wavelength conversion and emission of light by a typical wavelength conversion material, although the upper limit thereof is not limited to a particular value.

Further, the maximum excitation wavelength in the sheet-shaped structure is preferably 400 nm or less. In this way, when the maximum excitation wavelength falls within the UV region, the emission efficiency in the sheet-shaped structure can be enhanced without significantly reducing the visible light transmittance. Further, since the UV transmittance of the sheet-shaped structure decreases, UV radiation inside architectures, vehicles, and the like can be reduced. In view of such points, the maximum excitation wavelength is more preferably 390 nm or less. The maximum excitation wavelength is generally 200 nm or more, preferably 300 nm or more, although the lower limit value thereof is not limited to a particular value.

The sheet-shaped structure of the present invention preferably has a visible light transmittance of 5% or more. When the visible light transmittance is 5% or more, the sheet-shaped structure transmits a certain amount of light. Thereby, the sheet-shaped structure transmits part of light such as sunlight incident on one surface to emit it from the other surface, and therefore can be used as a transparent window.

For enhancing the transparency of the sheet-shaped structure, the visible light transmittance is more preferably 10% or more, further preferably 20% or more. Further, the visible light transmittance is preferably 92% or less, more preferably 89% or less, although the upper limit thereof is not limited to a particular value. The visible light transmittance means an average of visible light transmittances at 400 to 780 nm.

The sheet-shaped structure of the present invention may be composed of only one layer or may have two or more layers but preferably has two layers or more. Further, in the sheet-shaped structure of the present invention, at least one of the layers is preferably a substrate composed of any one of an inorganic glass plate and a resin plate. The resin plate is used as a so-called organic glass. In the sheet-shaped structure, one substrate may be provided, or two or more substrates may be provided. Further, in the present invention, a substrate may emit light, or a layer other than substrates may emit light.

The layer that emits light in the sheet-shaped structure may contain a wavelength conversion material. A material that converts light on the short wavelength side into light on the high wavelength side, specifically, into light having a maximum emission wavelength of 400 nm or more may be used as the wavelength conversion material. When the layer that emits light in the sheet-shaped structure has such a wavelength conversion material, the sheet-shaped structure can have the maximum emission wavelength and the maximum excitation wavelength described above.

Specific examples of the wavelength conversion material include barium stannate ($BaSnO_3$), mixed crystals containing ytterbium and cerium, mixed crystals containing praseodymium and ytterbium, mixed crystals containing bismuth and ytterbium, and compounds containing lanthanoid ions such as europium ions and thulium ions. The compounds containing lanthanoid ions are preferably complex compounds such as europium complexes. Further, barium stannate may be doped with metal ions such as iron and zinc.

The wavelength conversion material is preferably such a material capable of converting ultraviolet light into a light having a maximum emission wavelength of near-infrared light, and is particularly preferably barium stannate. Further, a wavelength conversion material in particulate form is preferably used, and the average particle size is, for example, 10 to 400 nm, preferably 10 to 200 nm, more preferably 10 to 100 nm. The average particle size can be measured by a nanoparticle analyzer (nano Partica SZ-100, manufactured by HORIBA, Ltd). The average particle size of the wavelength conversion material is measured according to the following procedure. First, the wavelength conversion material is dispersed in methanol to a concentration of 5 wt %, to obtain a measurement sample. Using the nanoparticle analyzer (nano Partica SZ-100), D50 of the aforementioned measurement sample is measured as the average particle size.

In the case where a substrate emits light, the substrate itself may contain a wavelength conversion material, and may absorb excitation light and emit light with wavelength conversion, and have a maximum emission wavelength of 400 nm or more. In such a case, the wavelength conversion material is preferably dispersed in the inorganic glass plate or the resin plate described above.

The content of the wavelength conversion material is preferably 0.01 to 3 parts by mass, more preferably 0.05 to 1.5 parts by mass, further preferably 0.1 to 1.0 part by mass, based on 100 parts by mass of inorganic materials composing the inorganic glass or 100 parts by mass of resins composing the resin plate.

Adjusting the content of the wavelength conversion material to such a lower limit or more enables a substrate of the sheet-shaped structure to sufficiently emit light. Further, adjusting it to such an upper limit or less can prevent the visible light transmittance from decreasing more than necessary.

In the case where a substrate emits light in the sheet-shaped structure, only one substrate is preferably provided. Providing only one substrate enables the sheet-shaped structure to have a simple structure. Of course, in the case where a substrate emits light, a plurality of substrates may be provided in the sheet-shaped structure. In such a case, only at least one substrate needs to emit light, but two or more substrates may emit light.

Further, in the case where a layer other than substrates emits light in the sheet-shaped structure, the layer that emits light is referred to as a sheet-shaped member in this description. The sheet-shaped member is such a layer that contains the wavelength conversion material, absorbs excitation light and converts the wavelength to emit the light, and has a maximum emission wavelength of 400 nm or more. The sheet-shaped member is provided on at least one surface side of a substrate.

Specific examples of the sheet-shaped member include a light emitting layer containing a resin and a wavelength conversion material dispersed in the resin. The resin to be used in the light emitting layer is preferably a thermoplastic resin. Use of a thermoplastic resin makes it easy for the sheet-shaped member to exert a function as an adhesive layer and facilitates bonding the sheet-shaped member to substrates or the like.

In the case where the wavelength conversion material is dispersed in the resin in the sheet-shaped member, the content of the wavelength conversion material is preferably 0.01 to 3 parts by mass, more preferably 0.05 to 1.5 parts by mass, further preferably 0.1 to 1.0 part by mass, based on 100 parts by mass of resins.

Adjusting the content of the wavelength conversion material to such a lower limit or more enables the sheet-shaped member to sufficiently emit light. Further, adjusting it to such an upper limit or less can prevent the visible light transmittance from decreasing more than necessary.

Further, the sheet-shaped member may be a coating formed on a surface of a substrate. The coating has a wavelength conversion material and may be formed by vacuum evaporation, sputtering, coating or the like of the wavelength conversion material.

Further, the sheet-shaped member may be constituted by forming a coating on one surface of a base film such as a resin film provided separately from the substrates. The coating has a wavelength conversion material and may be formed on the base film by vacuum evaporation, sputtering, coating or the like of the wavelength conversion material. The sheet-shaped member that is constituted by forming a coating on one surface of a base film may be directly bonded to a substrate by pressure bonding or the like or may be bonded to a substrate via another layer such as an interlayer, which will be described below. Further, a known resin such as polyester may be used as a resin in the base film. The thickness of the base film is, for example, about 1 mm or less, preferably 10 to 400 μm.

The coating having the wavelength conversion material may consist of the wavelength conversion material or may contain binder components or the like in addition to the wavelength conversion material or the like.

In the present invention, the sheet-shaped member is preferably a light emitting layer that contains a resin and a wavelength conversion material dispersed in the resin or a coating formed on a surface of a substrate. Further, the sheet-shaped member may be provided in one or more layers in the sheet-shaped structure but is preferably provided in only one layer.

Further, the sheet-shaped structure preferably has two substrates. In the case where the sheet-shaped structure has two substrates, the sheet-shaped member such as a light emitting layer is preferably disposed between the two substrates. In such a structure, the sheet-shaped member containing the wavelength conversion material is interposed between the two substrates, and therefore deterioration of the sheet-shaped member can be effectively suppressed. Further, it is more preferable that the two substrates be bonded together by the light emitting layer disposed therebetween.

Further, in the case where the sheet-shaped structure has two substrates, an air layer may be provided therebetween. That is, the sheet-shaped structure may have a structure separated in the thickness direction by the air layer. Such a structure in which an air layer is provided between two substrates is generally called double glazing. The air layer can be provided between the substrates by fixing the outer circumferential portion of each substrate to a frame such as a window frame. In the case where an air layer is provided, the sheet-shaped member is preferably a coating formed on a surface of a substrate.

Figure 2:
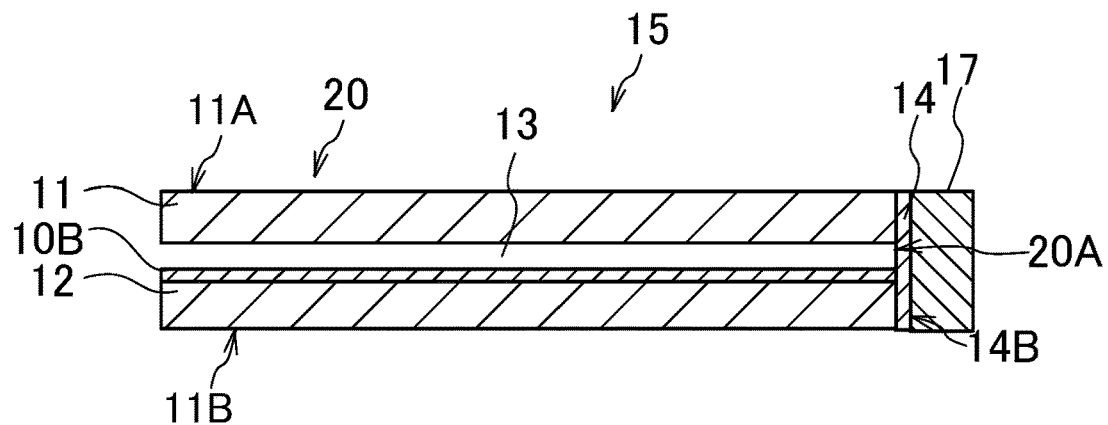
FIG. 2 is a schematic sectional view showing an embodiment of the solar cell system of the present invention.

Preferable embodiments of the sheet-shaped structure having two substrates are illustrated in FIGS. 1 and 2. As shown in FIG. 1, a sheet-shaped structure 20 preferably includes two substrates (first and second substrates 11 and 12) and a light emitting layer (sheet-shaped member) 10A disposed between the substrates and formed by dispersing a wavelength conversion material in a resin. The light emitting layer 10A bonds the first and second substrates 11 and 12 together.

Further, as shown in FIG. 2, the sheet-shaped structure 20 also preferably includes an air layer 13 provided between the first substrate 11 and the second substrate 12, and a coating (sheet-shaped member) 10B having a wavelength conversion material formed on a surface of one substrate (second substrate 12) that is opposed to the other substrate (first substrate 11).

As described above, light such as sunlight is incident on one surface of the sheet-shaped structure 20. For example, in the sheet-shaped structure 20 shown in FIGS. 1 and 2, light such as sunlight may be incident on a surface 11A side of the first substrate 11, or light such as sunlight may be incident on a surface 11B side of the second substrate 12.

However, in the sheet-shaped structure 20 shown in FIG. 2, light such as sunlight is preferably incident on the surface 11B side, for increasing the amount of light to be guided to the side surface.

Further, the sheet-shaped structure having two substrates may have an interlayer provided between the two substrates. The interlayer is a layer having a resin, preferably, a thermoplastic resin and configured to bond the two substrates together.

Specifically, in the structure shown in FIG. 2, the interlayer may be provided instead of the air layer. That is, the sheet-shaped structure may be constituted by forming a coating (sheet-shaped member) having a wavelength conversion material on a surface of one substrate (second substrate) and bonding the surface of the one substrate on which the coating is formed to the other substrate (first substrate) via an interlayer.

Further, the sheet-shaped structure may have a structure in which the sheet-shaped member is disposed between two interlayers, and the two interlayers with the sheet-shaped member disposed therebetween are further interposed by two substrates. In such a case, the sheet-shaped member may be a sheet-shaped member constituted by forming a coating having a wavelength conversion material on one surface of a base film or may be a light emitting layer which comprises a wavelength conversion material dispersed in a resin.

In the present invention, in the case where the sheet-shaped member is composed of a light emitting layer which comprises a wavelength conversion material dispersed in a resin, the thickness thereof is, for example, 3 mm to 50 mm, preferably 5 to 30 mm. Further, the thickness of the coating having the wavelength conversion material is, for example, 1 to 50 nm, preferably 3 to 25 nm. Further, the thickness of the air layer is, for example, 2 to 30 mm, preferably 5 to 20 mm.

Further, the thickness of each interlayer is, for example, 0.1 to 2.0 mm, preferably 0.2 to 1.0 mm.

Further, in the case where a substrate and a light emitting layer are provided, the refractive index of the substrate is preferably higher than the refractive index of the light emitting layer. In such a case, the difference in refractive index between the substrate and the light emitting layer is preferably 0.01 or more, more preferably 0.03 or more, further preferably 0.07 or more. Further, the difference in refractive index is generally 0.5 or less, preferably 0.3 or less, although the upper limit thereof is not limited to a particular value.

For increasing the amount of light to be guided to the side surface of the sheet-shaped structure, the refractive index of the light emitting layer is preferably 1.30 to 1.80, more preferably 1.40 to 1.60. Further, the refractive index of each substrate is preferably 1.35 to 1.85, more preferably 1.45 to 1.65.

For guiding the light emitted from the wavelength conversion material to the side surface of the sheet-shaped structure more efficiently and enhancing the power generation efficiency, a reflective layer such as a metal film, a heat reflecting film, and an infrared reflecting film may be provided. In the case where the surface of the sheet-shaped structure on which light such as sunlight is incident is referred to as one surface, and the opposite surface is referred to as the other surface, the reflective layer is preferably provided on the other surface side rather than the layer that emits light in the sheet-shaped structure.

For example, in the case where two substrates (first and second substrates) are provided, the sheet-shaped member is provided between the two substrates, and light such as sunlight is incident on the surface side of the first substrate, the reflective layer may be provided on the surface of the second substrate or the like. Further, in the case where only one substrate is provided, the reflective layer may be provided on the surface of the substrate opposite to the surface on which sunlight or the like is incident.

As described above, the resin to be used for the interlayer or the light emitting layer is preferably a thermoplastic resin. Further, the thermoplastic resin to be used for the interlayer or the light emitting layer is not specifically limited, but examples thereof include a polyvinyl acetal resin, an ethylene-vinyl acetate copolymer resin, an ionomer resin, a polyurethane resin, and a thermoplastic elastomer. Use of these resins facilitates ensuring adhesion of the interlayer or the light emitting layer to the substrate or the like. In each of the light emitting layer and the interlayer, one of the thermoplastic resins may be used alone, or two or more of them may be used in combination. Among these, a polyvinyl acetal resin is particularly suitable, for exerting excellent adhesion to glass, in the case where each of the light emitting layer and the interlayer contains a plasticizer.

(Polyvinyl Acetal Resin)

The polyvinyl acetal resin is not specifically limited as long as the polyvinyl acetal resin is obtained by acetalization of polyvinyl alcohol with aldehyde, but is suitably a polyvinyl butyral resin.

The lower limit of the degree of acetalization of the aforementioned polyvinyl acetal resin is preferably 40 mol %, the upper limit is preferably 85 mol %, the lower limit is more preferably 60 mol %, and the upper limit is more preferably 75 mol %.

The lower limit of the amount of hydroxyl groups in the polyvinyl acetal resin is preferably 15 mol %, and the upper limit is preferably 35 mol %. Adjusting the amount of hydroxyl groups to 15 mol % or more facilitates achieving good adhesion to a substrate, particularly, to a substrate that is inorganic glass, and achieving good penetration resistance or the like of the sheet-shaped structure. Further, adjusting the amount of hydroxyl groups to 35 mol % or less prevents the sheet-shaped structure from becoming excessively hard. The lower limit of the amount of hydroxyl groups is more preferably 25 mol %, and the upper limit is more preferably 33 mol %.

Also in the case of using a polyvinyl butyral resin as the polyvinyl acetal resin, the lower limit of the amount of hydroxyl groups is preferably 15 mol %, the upper limit is preferably 35 mol %, the lower limit is more preferably 25 mol %, and the upper limit is more preferably 33 mol %, from the same point of view. The degree of acetalization and the amount of hydroxyl groups can be measured, for example, by a method according to JIS K6728 "Testing methods for polyvinyl butyral".

The polyvinyl acetal resin can be prepared by acetalization of polyvinyl alcohol with aldehyde. Polyvinyl alcohol is typically obtained by saponification of polyvinyl acetate, and polyvinyl alcohol with a saponification degree of 80 to 99.8 mol % is generally used therefor.

The lower limit of the degree of polymerization of the polyvinyl acetal resin is preferably 500, and the upper limit is preferably 4000. Adjusting the degree of polymerization to 500 or more allows the sheet-shaped structure to have good penetration resistance. Further, adjusting the degree of polymerization to 4000 or less facilitates forming the sheet-shaped structure. The lower limit of the degree of polymerization is more preferably 1000, and the upper limit is more preferably 3600.

The aldehyde is not specifically limited, but typically, an aldehyde having 1 to 10 carbon atoms is suitably used therefor. The aldehyde having 1 to 10 carbon atoms is not specifically limited, and examples thereof include n-butyraldehyde, isobutyraldehyde, n-valeraldehyde, 2-ethylbutyraldehyde, n-hexylaldehyde, n-octylaldehyde, n-nonylaldehyde, n-decylaldehyde, formaldehyde, acetaldehyde, and benzaldehyde. Among these, n-butyraldehyde, n-hexylaldehyde, and n-valeraldehyde are preferable, and n-butyraldehyde is more preferable. These aldehydes may be used singly, or in combinations of two or more.

(Ethylene-Vinyl Acetate Copolymer Resin)

The ethylene-vinyl acetate copolymer resin may be an uncrosslinked ethylene-vinyl acetate copolymer resin or may be a high-temperature crosslinkable ethylene-vinyl acetate copolymer resin. Further, an ethylene-vinyl acetate modified resin such as a saponified product of ethylene-vinyl acetate copolymer and a hydrolysate of ethylene-vinyl acetate can also be used as the ethylene-vinyl acetate copolymer resin.

The ethylene-vinyl acetate copolymer resin has a vinyl acetate content, as measured according to JIS K6730 "Testing methods for ethylene-vinyl acetate resin", of preferably 10 to 50 mass %, more preferably 20 to 40 mass %. Adjusting the vinyl acetate content to such a lower limit or more facilitates achieving good adhesion to a substrate or the like and good penetration resistance of the sheet-shaped structure. Further, adjusting the vinyl acetate content to such an upper limit or less enhances the fracture strength of the light emitting layer or the interlayer and allows the sheet-shaped structure to have good impact resistance.

(Ionomer Resin)

The ionomer resin is not specifically limited, and various ionomer resins can be used therefor. Specifically, examples thereof include ethylene-based ionomers, styrene-based ionomers, perfluorocarbon-based ionomers, telechelic ionomers, and polyurethane ionomers. Among these, ethylene-based ionomers are preferable, for allowing the sheet-shaped structure to have good mechanical strength, good durability, good transparency, and the like, and for achieving excellent adhesion to a substrate in the case when the substrate is inorganic glass.

As such an ethylene-based ionomer, an ionomer of ethylene-unsaturated carboxylic acid copolymer is suitably used because of its excellent transparency and toughness. The ethylene-unsaturated carboxylic acid copolymer is a copolymer at least having constitutional units derived from ethylene and constitutional units derived from unsaturated carboxylic acid, and optionally having constitutional units derived from other monomers.

Examples of the unsaturated carboxylic acid include acrylic acid, methacrylic acid, and maleic acid. Acrylic acid and methacrylic acid are preferable. Further, examples of the other monomers include acrylic acid ester, methacrylic acid ester, and 1-butene.

As for the ethylene-unsaturated carboxylic acid copolymer, in the case where all constitutional units contained in the copolymer is defined as 100 mol %, the copolymer preferably has 75 to 99 mol % of constitutional units derived from ethylene and preferably has 1 to 25 mol % of constitutional units derived from unsaturated carboxylic acid.

The ionomer of ethylene-unsaturated carboxylic acid copolymer is an ionomer resin obtained by neutralizing or crosslinking at least part of carboxyl groups contained in the ethylene-unsaturated carboxylic acid copolymer with metal ions, and the degree of neutralization of the carboxyl groups is typically 1 to 90%, preferably 5 to 85%.

Examples of ion sources contained in the ionomer resin include alkali metals such as lithium, sodium, potassium, rubidium, and cesium, and polyvalent metals such as magnesium, calcium, and zinc. Sodium and zinc are preferable.

The method for producing such an ionomer resin is not specifically limited, and a conventionally known production method can be used for the production. For example, in the case where an ionomer of ethylene-unsaturated carboxylic acid copolymer is used as the ionomer resin, ethylene and unsaturated carboxylic acid are radically copolymerized under a high temperature and high pressure, to produce an ethylene-unsaturated carboxylic acid copolymer. Then, the ethylene-unsaturated carboxylic acid copolymer is reacted with a metal compound containing the aforementioned ion source, so that the ionomer of ethylene-unsaturated carboxylic acid copolymer can be produced.

(Polyurethane Resin)

Examples of the polyurethane resin include polyurethane obtained by reacting an isocyanate compound with a diol compound, and polyurethane obtained by reacting an isocyanate compound with a diol compound and further a chain extender such as polyamine. Further, the polyurethane resin may contain sulfur atoms. In such a case, it is preferable that part or whole of the aforementioned diol be selected from the group consisting of polythiols and sulfur-containing polyols. The polyurethane resin can allow good adhesion to a resin plate. Therefore, the polyurethane resin is suitably used in the case where at least one of the substrates is a resin plate.

(Thermoplastic Elastomer)

Examples of the thermoplastic elastomer include styrene-based thermoplastic elastomers and aliphatic polyolefins. The styrene-based thermoplastic elastomers are not specifically limited, and known elastomers can be used. Styrene-based thermoplastic elastomers generally have a styrene monomer-polymer block serving as a hard segment and a conjugated diene compound-polymer block or a hydrogenated block thereof serving as a soft segment. Specific examples of the styrene-based thermoplastic elastomers include a styrene-isoprene diblock copolymer, a styrene-butadiene diblock copolymer, a styrene-isoprene-styrene triblock copolymer, a styrene-butadiene/isoprene-styrene triblock copolymer, a styrene-butadiene-styrene triblock copolymer, and hydrogenated products thereof.

The aliphatic polyolefins may be saturated aliphatic polyolefins or may be unsaturated aliphatic polyolefins. The aliphatic polyolefins may be polyolefins containing chain olefins as monomers or may be polyolefins containing cyclic olefins as monomers. For effectively enhancing the storage stability and the sound insulating properties of the interlayer, the aliphatic polyolefin is preferably a saturated aliphatic polyolefin.

Examples of materials for the aliphatic polyolefins include ethylene, propylene, 1-butene, trans-2-butene, cis-2-butene, 1-pentene, trans-2-pentene, cis-2-pentene, 1-hexene, trans-2-hexene, cis-2-hexene, trans-3-hexene, cis-3-hexene, 1-heptene, trans-2-heptene, cis-2-heptene, trans-3-heptene, cis-3-heptene, 1-octene, trans-2-octene, cis-2-octene, trans-3-octene, cis-3-octene, trans-4-octene, cis-4-octene, 1-nonene, trans-2-nonene, cis-2-nonene, trans-3-nonene, cis-3-nonene, trans-4-nonene, cis-4-nonene, 1-decene, trans-2-decene, cis-2-decene, trans-3-decene, cis-3-decene, trans-4-decene, cis-4-decene, trans-5-decene, cis-5-decene, 4-methyl-1-pentene, and vinyl cyclohexane.

(Plasticizer)

In the case where the light emitting layer or the interlayer comprises a thermoplastic resin, the light emitting layer or the interlayer may further comprise a plasticizer. When the light emitting layer or the interlayer comprises a plasticizer, the light emitting layer or the interlayer is flexible, as a result of which the sheet-shaped structure is flexible. Further, adhesion to a substrate, particularly, in the case where a substrate is inorganic glass, can be enhanced. In the case where a polyvinyl acetal resin is used as the thermoplastic resin, the inclusion of a plasticizer in the layer is particularly effective.

Examples of the plasticizer include triethylene glycol di-2-ethylbutyrate, triethylene glycol di-2-ethyl hexanoate, triethylene glycol dicaprylate, triethylene glycol di-n-octanoate, triethylene glycol di-n-heptanoate, tetraethylene glycol di-n-heptanoate, tetraethylene glycol di-2-ethyl hexanoate, dibutyl sebacate, dioctyl azelate, dibutyl carbitol adipate, ethylene glycol di-2-ethylbutyrate, 1,3-propylene glycol di-2-ethylbutyrate, 1,4-butylene glycol di-2-ethylbutyrate, 1,2-butylene glycol di-2-ethylbutyrate, diethylene glycol di-2-ethylbutyrate, diethylene glycol di-2-ethylhexanoate, dipropylene glycol di-2-ethylbutyrate, triethylene glycol di-2-ethylpentanoate, tetraethylene glycol di-2-ethylbutyrate, diethylene glycol dicaprylate, triethylene glycol di-n-heptanoate, tetraethylene glycol di-n-heptanoate, triethylene glycol di-2-ethylbutyrate, dihexyl adipate, dioctyl adipate, hexylcyclohexyl adipate, diisononyl adipate, heptylnonyl adipate, dibutyl sebacate, oil-modified sebacic alkyds, a mixture of a phosphate ester and an adipate ester, adipate esters, mixed adipate esters prepared from an alkyl alcohol having 4 to 9 carbon atoms and a cyclic alcohol having 4 to 9 carbon atoms, and adipate esters having 6 to 8 carbon atoms such as hexyl adipate. Among these plasticizers, triethylene glycol-di-2-ethyl hexanoate (3GO) is particularly suitably used.

In the light emitting layer or the interlayer, the content of plasticizer is not specifically limited, but the lower limit is preferably 30 parts by mass, and the upper limit is preferably 70 parts by mass, relative to 100 parts by mass of the thermoplastic resin. When the content of plasticizer is 30 parts by mass or more, the sheet-shaped structure becomes appropriately flexible, and its handleability and the like is improved. Further, when the content of plasticizer is 70 parts by mass or less, separation of the plasticizer from the light emitting layer or the interlayer is prevented. The lower limit of the content of plasticizer is more preferably 35 parts by mass, and the upper limit is more preferably 63 parts by mass.

Further, in the case when a thermoplastic resin is comprised in the light emitting layer or the interlayer of the present invention, the thermoplastic resin, or the thermoplastic resin and the plasticizer is comprised as the main component therein. The total amount of the thermoplastic resin and the plasticizer is typically 70 mass % or more, preferably 80 mass % or more, further preferably 90 mass % or more, based on the total amount of the light emitting layer or the interlayer.

(Other Additives)

The light emitting layer and the interlayer each may contain additives such as antioxidants, adhesion modifiers, pigments, dyes, ultraviolet absorbers, and infrared absorbers, as needed. Among these, antioxidants are preferably used.

The antioxidants are not specifically limited, and examples thereof include 2,2-bis[[[3-(3,5-di-tert-butyl-4-hydroxyphenyl)propionyl]oxy]methyl]propane-1,3-diol 1,3-bis[3-(3,5-di-tert-butyl-4-hydroxyphenyl) propionate], 4,4'-thiobis(6-tert-butyl-3-methylphenol), 4,4'-dimethyl-6,6'-di (tert-butyl)[2,2'-methylenebis(phenol)], 2,6-di-t-butyl-p-cresol, and 4,4'-butylidenebis-(6-t-butyl-3-methylphenol).

(Substrate)

Any substrate can be used without specific limitation, as long as it can be used for windows, and examples thereof include inorganic glass plates and resin plates. The inorganic glass plates are not specifically limited, but examples thereof include clear glass, float plate glass, polished plate glass, figured glass, net-wired plate glass, line-wired plate glass, and green glass.

Further, resin plates, generally called resin glass, are used therefor and are not specifically limited, but examples thereof include transparent resin plates composed of resins such as polycarbonates, acrylic resins, acrylic copolymer resins, and polyesters.

Further, a glass transition temperature of the resin plate is preferably 100° C. or more. When the glass transition temperature is 100° C. or more, sufficient strength can be ensured in the case when a resin plate is used as the substrate.

Further, the glass transition temperature of the resin plate is more preferably 110° C. or more and preferably 300° C. or less, more preferably 200° C. or less. Examples of the method for measuring the glass transition temperature include differential scanning calorimetry (DSC) according to JIS K7121.

In the case where the sheet-shaped structure has two or more substrates, the plurality of substrates may be composed of the same material as each other or may be composed of different materials. For example, in the case where two substrates are provided, one may be an inorganic glass plate, and the other may be a resin plate. However, in the case where a plurality of substrates are provided, the plurality of substrates are all preferably inorganic glass plates or resin plates.

Each substrate is a transparent substrate, and the visible light transmittance thereof is favorably as high as possible, but is practically 5% or more, preferably 20% or more. Further, each substrate may have a visible light transmittance of 100% or less, practically 99% or less. In the case where two or more substrates are provided, each substrate may have the same or a different visible light transmittance.

Further, the thickness of each substrate is not specifically limited. but is, for example, about 0.1 to 15 mm, preferably 0.5 to 5 mm. In the case where the sheet-shaped structure has two substrates or more, the thickness of each substrate may be the same as or different from each other.

The method for producing the sheet-shaped structure of the present invention is not specifically limited. For example, in the case where the sheet-shaped structure is composed of a plurality of layers, the plurality of layers may be stacked together and integrated by thermocompression bonding or the like. Further, in the case where two substrates are provided, the two substrates and each layer (such as a light emitting layer or an interlayer) to be interposed between the substrates may be prepared, stacked together, and integrated by thermocompression bonding or the like. Further, in the case where the sheet-shaped member is a coating having a wavelength conversion material, as described above, the coating may be applied to the substrate in advance before integration.

Further, in the case where an air layer is provided between two substrates, the sheet-shaped member is formed on any one of the substrates as required, and thereafter, the two substrates may be fixed to a frame.

Further, the interlayer, the light emitting layer, or the like may be formed into a sheet by extrusion molding or the like, and thereafter the sheet may be stacked with substrates or the like, but, at the step of molding, the sheet may be stretched in the MD direction, the TD direction, or both directions. Further, the sheet-shaped structure may be cut into a desired size after integration.

[Antireflection Material]

The light emitting structure of the present invention has an antireflection material. The antireflection material is a member that prevents reflection of light to be emitted from a side surface of the sheet-shaped structure. As shown in FIGS. 1 and 2, an antireflection material 14 is provided in a light emitting structure 15 so as to be adjacent to a side surface 20A of the sheet-shaped structure 20.

The antireflection material may be formed as a coating by applying an antireflection material onto the side surface of the sheet-shaped structure by vacuum evaporation, coating, sputtering, or the like, or may be formed by bonding a film-shaped antireflection material to the side surface. Further, the antireflection material is preferably provided directly in contact with the side surface of the sheet-shaped structure by direct application or bonding to the side surface of the sheet-shaped structure but may be provided on the side surface of the sheet-shaped structure via an adhesive or the like.

The antireflection material may be provided over the entire periphery of the side surface of the sheet-shaped structure or may be provided only a part thereof. Further, the antireflection material may be provided throughout the thickness direction of the sheet-shaped structure or may be provided in a part of the thickness direction. In the case where the antireflection material is provided in a part of the thickness direction, it is preferably provided on at least the outer side of the layer that emits light (such as a sheet-shaped member).

Further, the antireflection material is preferably provided at a position corresponding to the position where a power generation cell, which will be described below, is disposed. Accordingly, in the case where the power generation cell is provided in a part of the outer side of the side surface of the sheet-shaped structure, the antireflection material may be provided also in the corresponding part of the side surface. Alternatively, in the case where the power generation cell is provided throughout the entire periphery of the outer side of the side surface of the sheet-shaped structure, the antireflection material may be also provided throughout the entire periphery.

The antireflection material preferably has a visible light transmittance of 70% or more. When the visible light transmittance is 70% or more, absorption of light guided to the side surface of the sheet-shaped structure by the antireflection material may be prevented. The visible light transmittance is preferably 80% or more, further preferably 90% or more. The visible light transmittance is preferably as high as possible and may be 100% or less, practically 99% or less.

Examples of the antireflection material include an antireflection material having a moth-eye structure. The moth-eye structure has a fine projection pattern on one surface of a film. In the moth-eye structure, fine projections are preferably aligned at a pitch of the maximum emission wavelength of the sheet-shaped structure or less. When the interval of the fine projections is the maximum emission wavelength or less, the moth-eye structure facilitates preventing reflection of light emitted by the sheet-shaped structure on the side surface.

The fine projections may be in any shape such as columnar shapes including circular cylindrical, triangular prism, quadrangular prism, pentagonal prism, and hexagonal prism shapes, and tapered shapes including conical, triangular pyramid, and quadrangular pyramid shapes.

In the case where the antireflection material 14 has a moth-eye structure, the surface on which fine projections are formed is disposed on an outer side surface 14B of the antireflection material 14 (that is, the surface opposite to the surface on the sheet-shaped structure 15 side of the antireflection material 14).

The pitch between the fine projections is preferably 1 to 300 nm, more preferably 50 to 200 nm. Further, the height of the fine projections is preferably 1 to 300 nm, more preferably 50 to 200 nm.

The antireflection material having a moth-eye structure may be, for example, pressure-bonded or bonded using an adhesive to the side surface of the sheet-shaped structure.

Further, other preferable specific examples of the antireflection material include antireflection films composed of antireflection materials such as magnesium fluoride ($MgF_2$), silicon oxides including silicon dioxide ($SiO_2$), silicon nitrides, fluoride polymers including polytetrafluoroethylene, and ethylene vinyl acetate copolymer resins. Among these, magnesium fluoride ($MgF_2$) is preferable. Such an antireflection film may consist of antireflection materials, but may contain other components as long as functions as the antireflection material are not impaired.

The antireflection film has a refractive index lower than the refractive index of at least one of the layers included in the sheet-shaped structure. Further, in the case where the sheet-shaped structure has the aforementioned substrate, the antireflection film has a refractive index lower than that of the substrate, more preferably has a refractive index lower than those of all the layers of the sheet-shaped structure. When the antireflection film having a refractive index lower than that of each layer, particularly, of each substrate of the sheet-shaped structure, it can prevent reflection on the side surface of the sheet-shaped structure. The refractive index of the antireflection film is preferably 1.5 or less, and preferably 1.4 or less. Further, the refractive index of the antireflection film is more than 1, preferably 1.15 or more, more preferably 1.25 or more.

Further, the antireflection film may have a single-layer structure or a multi-layer structure. The antireflection film having a multi-layer structure is formed by laminating multiple layers so that the refractive indices of adjacent layers are different from each other. Specifically, examples thereof include a multi-layer film obtained by alternately laminating layers having relatively low refractive indices and layers having relatively high refractive indices. The antireflection film having a multi-layer structure is particularly suitable for the case where the emission maximum wavelength of the sheet-shaped structure is high (such as 700 nm or more, preferably 780 nm or more). In the case where the antireflection film has a multi-layer structure, the refractive index of each layer is lower than the refractive index of at least one of the layers included in the sheet-shaped structure, preferably, lower than the refractive index of each substrate, more preferably, lower than the refractive indices of all the layers included in the sheet-shaped structure.

The antireflection film may be applied onto the side surface of the sheet-shaped structure by vacuum evaporation, sputtering, coating, or the like. The thickness of the antireflection film is, for example, 1 to 500000 nm, preferably 3 to 250000 nm.

Further, a resin film having such an antireflection film on one surface may be adhered on the side surface of the sheet-shaped structure 20. As such a resin film having the antireflection film, a commercially available product such as "AR1.5-M1210" (available from Dexerials Corporation) may be used.

Figure 3:
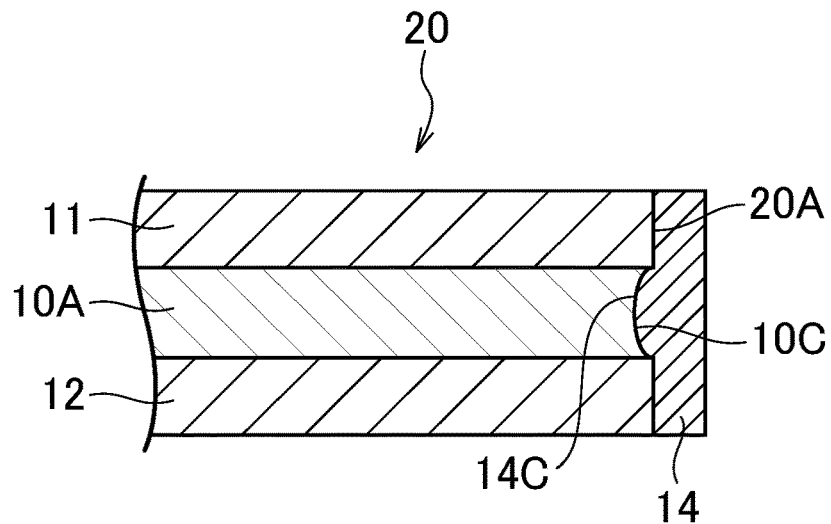
FIG. 3 is a schematic sectional view showing an embodiment of the light emitting structure of the present invention.

As shown in FIG. 1, the light emitting layer 10A may be flat on the side surface 20A of the sheet-shaped structure 20, but as shown in FIG. 3, the light emitting layer 10A may be recessed inwardly to form a recess 10C. In such a case, the antireflection material 14 enters the recess 10C, so that a projection 14C is formed in the antireflection material 14. Such a structure increases the contact area between the light emitting layer 10A and the antireflection material 14 and allows the interface between the recess 10C of the light emitting layer 10A and the projection 14C of the antireflection material 14 to function as a concave lens. Therefore, the incident ratio from the light emitting layer 10A to the antireflection material 14 increases, and the amount of light emitted from the side surface of the light emitting structure 15 increases.

Figure 4:
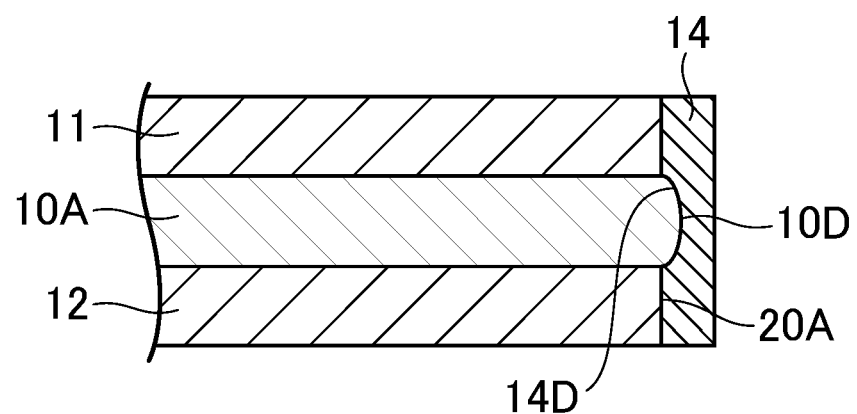
FIG. 4 is a schematic sectional view showing an embodiment of the light emitting structure of the present invention.

Alternatively, as shown in FIG. 4, a projection 10D may be formed by the light emitting layer 10A expanding outwardly on the side surface 20A of the sheet-shaped structure 20, and a portion of the antireflection material 14 where the light emitting layer 10A is provided may be depressed to form a recess 14D. Such a structure increases the contact area between the light emitting layer 10A and the antireflection material 14 and reduces the distance between the power generation cell and the light emitting layer 10A, therefore increasing the amount of light incident from the light emitting layer 10A to the power generation cell via the antireflection material 14.

The method for forming such a projection or such a recess in the light emitting layer is not specifically limited, but is preferably a method using thermal contraction or thermal expansion of the light emitting layer. Specifically, the light emitting layer (sheet-shaped member) after being stretched is disposed between two substrates, followed by heating to a predetermined temperature or more, thereby causing thermal contraction in the stretching direction. As a result, both end faces in the stretching direction are recessed to form recesses. For example, the light emitting layer after being stretched in the MD direction is disposed between two substrates, followed by heating, thereby causing thermal contraction in the MD direction. As a result, both end faces in the MD direction are recessed to form recesses. Then, when an antireflection material is provided on a side surface of the sheet-shaped structure with such a recess formed by the thermal contraction, the antireflection material enters the recess, and a projection is formed in the antireflection material.

Alternatively, the light emitting layer (sheet-shaped member) after being stretched is disposed between two substrates, followed by heating to a predetermined temperature or more, thereby causing thermal expansion in a direction orthogonal to the stretching direction. As a result, both end faces in the orthogonal direction expand to form projections. For example, the light emitting layer after being stretched in the MD direction is disposed between the two substrates, followed by heating, thereby causing thermal expansion in the TD direction. As a result, both end faces in the TD direction expand to form projections. Then, when an antireflection material is provided on a side surface of the sheet-shaped structure with such a projection formed by the thermal expansion, a recess is formed in the antireflection material corresponding to the projection.

The thermal contraction or thermal expansion are not specifically limited, but may be achieved by heating for thermocompression bonding during the integration of the substrates with the light emitting layer and the like or by separate heating after the integration.

[Uses of Light Emitting Structure]

The light emitting structure of the present invention is used with one surface of the sheet-shaped structure disposed on the outdoor side on which sunlight is incident. The sheet-shaped structure of the present invention can be used in various fields but is preferably used for outdoor windows of various vehicles such as automobiles, trains, and ships, various constructions such as buildings, apartments, stand-alone houses, halls, and gymnasiums, and the like. Outdoor windows in this description mean windows disposed at positions on which sunlight is incident. Accordingly, outdoor windows are generally disposed on the outer sides of constructions or the outer sides of vehicles, but outdoor windows in this description also include inner windows of double windows as long as they are disposed at positions on which sunlight is incident.

Further, the light emitting structure may be used for rear windows, side windows, or roof windows in automobiles.

<Solar Cell System>

The solar cell system of the present invention includes the aforementioned light emitting structure and a power generation cell. As shown in FIGS. 1 and 2, a power generation cell 17 is provided outside the antireflection material 14 on the side surface 20A of the sheet-shaped structure 20. When the power generation cell 17 is disposed in such a manner, light emitted by the sheet-shaped structure 20 and guided to the side surface 20A therein passes through the antireflection material 14 and thereafter enters the power generation cell 17. This structure reduces the reflection loss of the light emitted by the sheet-shaped structure 20 on the side surface 20A in the solar cell system and improves the power generation efficiency in the power generation cell 17.

The power generation cell may be disposed at at least one site on the outer side on the side surface of the sheet-shaped structure. Accordingly, the power generation cell may be provided in a part of the outer side on the side surface of the sheet-shaped structure or may be provided throughout the entire periphery of the outer side on the side surface of the sheet-shaped structure.

As shown in FIGS. 1 and 2, the power generation cell 17 is preferably disposed so as to be able to receive light propagated inside the sheet-shaped structure 20 throughout the thickness direction of the sheet-shaped structure 20, but may be disposed so as to be able to receive light propagated inside the sheet-shaped structure 20 in a part of the thickness direction. In the case where the power generation cell is disposed so as to be able to receive light in a part of the thickness direction, the power generation cell is preferably provided at least on the outer side of the layer that emits light so as to be able to receive at least light emitted from the layer that emits light (for example, the light emitting layer 10A).

Further, as shown in FIGS. 1 and 2, the power generation cell 17 is generally disposed in contact with the outer side surface 14B of the antireflection material.

[Power Generation Cell]

The power generation cell used in the solar cell system is not specifically limited, as long as the cell that converts light into electricity. A cell that efficiently converts light with the maximum emission wavelength of the sheet-shaped structure or wavelengths around the maximum into electricity is preferably used as the power generation cell. Accordingly, the power generation efficiency of the power generation cell may be highest at any wavelength of 400 nm or more, preferably at any wavelength of 500 nm or more, more preferably of 700 to 1400 nm, further preferably of 780 to 1300 nm. When the power generation efficiency from light in the near infrared region is high as described above, the power generation efficiency can be enhanced in the case when the maximum emission wavelength of the sheet-shaped member is in the near-infrared region.

Specific examples of the power generation cell include power generation cells in which a silicon-based semiconductor such as monocrystalline silicon, polycrystalline silicon, and amorphous silicon is used as a photoelectric conversion layer thereof, power generation cells in which a compound semiconductor typified by CuInSe-based, Cu(In,Ga)Se-based, Ag(In,Ga)Se-based, CuInS-based, Cu(In,Ga)S-based, Ag(In,Ga)S-based compounds, and solid solutions thereof, and CIS-based, CIGS-based, GaAs-based, and CdTe-based is used as a photoelectric conversion layer thereof, and organic power generation cells in which an organic material such as an organic dye is used for a photoelectric conversion layer thereof.

To enhance the power generation efficiency from light in the near infrared region, a power generation cell in which a silicon semiconductor or a compound semiconductor (CIS or CIGS) is used for a photoelectric conversion layer thereof is preferable.

EXAMPLES

The present invention will be described further in detail by referring to examples, but the present invention is by no means limited by these examples at all.

The methods for measuring the physical properties and the method for evaluating the light emitting structure were as follows.

[Maximum Excitation Wavelength and Maximum Emission Wavelength]

The maximum excitation wavelength is a wavelength of excitation light at which the fluorescence intensity detected under the condition of the maximum emission wavelength reaches a maximum, when one surface of a sheet-shaped structure or a sheet-shaped member is perpendicularly irradiated with excitation light with wavelengths of 300 to 500 nm by using a device Fluorolog-3 manufactured by HORIBA, Ltd. The maximum emission wavelength is a wavelength at which the emission intensity that is detected under the condition of 500 to 1400 nm reaches a maximum, when light with the maximum excitation wavelength is radiated.

[Refractive Index]

The refractive index was measured with a digital Abbe refractometer DR-A1 (manufactured by ATAGO CO., LTD).

[Visible Light Transmittance]

The visible light transmittance was measured according to JISR3212 with a measurement device: an ultraviolet-visible-infrared spectrophotometer (U4150, manufactured by Hitachi High-Technologies Corporation), and an average of visible light transmittances at 400 to 780 nm was determined.

(Evaluation of Electric Generating Capacity)

A silicon solar cell module for power generation (product name "ETMP250-0.5V", manufactured by AKIZUKI DENSHI TSUSHO CO., LTD., store code: M-04179) was disposed on the outer side of a side surface of the sheet-shaped structure obtained in each of Examples and Comparative Example. The power generation cell was disposed in contact with an outer side surface of an antireflection material in Examples, whereas the power generation cell was disposed in contact with a side surface of the sheet-shaped structure in Comparative Example.

The electric generating capacity was evaluated by allowing simulated sunlight to be incident on one surface (a surface of a first substrate) side of the sheet-shaped structure and measuring the electric generating capacity per unit area of the power generation cell. As a light source of simulated sunlight, a solar simulator HAL-C100, manufactured by Asahi Spectra Co., Ltd., was used.

A: Electric generating capacity per unit area increased by 1.2 times, compared to that of Comparative Example 1.

B: Electric generating capacity per unit area increased as compared with that of Comparative Example 1 only by less than 1.2 times. However, among those evaluated as B, those with small increment in electric generating capacity (less than 1.1 times) were evaluated as B−.

Compounds used for the sheet-shaped member of each of Examples and Comparative Example were as follows.

Polyvinyl butyral resin (PVB): an degree of acetalization of 69 mol %, an amount of hydroxyl groups of 30 mol %, and a degree of polymerization of 1700

Ethylene-vinyl acetate copolymer resin (EVA): a vinyl acetate content of 32 mass %

Thermoplastic elastomer: aliphatic polyolefin "ABSORTOMER EP-1001" available from Mitsui Chemicals, Inc.

Polyurethane resin: ELASTOLLAN C60D, available from BASF SE

Wavelength conversion material (1): europium complex, particulate, average particle size: 50 μm Wavelength conversion material (2): barium stannate ($BaSnO_3$), particulate, average particle size: 50 μm Plasticizer: triethylene glycol di-2-ethyl hexanoate (3GO)

Antioxidant: 2,6-di-t-butyl-p-cresol (BHT)

Example 1

As shown in Table 1, two sheets of clear glass (with a thickness of 2.5 mm, a length of 300 mm, a width of 300 mm, a visible light transmittance of 90%, and a refractive index of 1.52) were prepared as first and second substrates.

Further, 0.05 parts by mass of the wavelength conversion material (1), 40 parts by mass of the plasticizer, and 0.2 parts by mass of the antioxidant were mixed with 100 parts by mass of polyvinyl butyral resin (PVB), followed by extrusion molding of the mixture using a twin-screw anisotropic extruder, to obtain a sheet-shaped member with a thickness of 0.8 mm. The sheet-shaped member was aged at a temperature of 80° C. and was thereafter cut into a length of 300 mm and a width of 300 mm.

Thereafter, one clear glass, the sheet-shaped member, and the other clear glass were stacked in this order, followed by preheating in an oven at a temperature of 240° C. for 90 seconds, and were then temporarily pressure-bonded using a heating roll. The temporarily pressure-bonded mixture was pressure-bonded using an autoclave under conditions of 150° C. and a pressure of 1.2 MPa for 30 minutes, to obtain a sheet-shaped structure having the laminated structure comprised of first substrate/sheet-shaped member (light emitting layer)/second substrate, as shown in FIG. 1. The maximum excitation wavelength and the maximum emission wavelength of the sheet-shaped structure were as shown in Table 1. Further, the refractive index of the light emitting layer was 1.47.

Next, an antireflection film (with a refractive index of 1.38) made of $MgF_2$ with a thickness of 100 nm was formed in a part of a side surface of the sheet-shaped structure by sputtering, to obtain a light emitting structure.

Example 2

The same procedure was performed in the same manner as in Example 1, except that 0.05 parts by mass of the wavelength conversion material (1) and 0.2 parts by mass of the antioxidant were mixed with 100 parts by mass of ethylene-vinyl acetate copolymer resin (EVA), followed by extrusion molding of the mixture using a twin-screw anisotropic extruder, to obtain a sheet-shaped member (light emitting layer) with a thickness of 0.8 mm. The refractive index of the light emitting layer was 1.49.

Example 3

The same procedure was performed in the same manner as in Example 1, except that 0.05 parts by mass of the wavelength conversion material (1) and 0.2 parts by mass of the antioxidant were mixed with 100 parts by mass of the thermoplastic elastomer, followed by extrusion molding of the mixture using a twin-screw anisotropic extruder, to obtain a sheet-shaped member (light emitting layer) with a thickness of 0.8 mm. The refractive index of the light emitting layer was 1.49.

Example 4

The same procedure was performed in the same manner as in Example 1, except that 0.2 parts by mass of the wavelength conversion material (2) was used instead of 0.05 parts by mass of the wavelength conversion material (1), and AR1.5-M1210 (clear type), available from Dexerials Corporation was used as an antireflection material. The refractive index of the light emitting layer was 1.47.

Example 5

Transparent resin plates (with a glass transition temperature of 150° C.) made of polycarbonate with a thickness of 2.5 mm, a refractive index of 1.59, and a visible light transmittance of 90% were prepared as the first and second substrates. Further, 0.05 parts by mass of the wavelength conversion material (1) and 0.2 parts by mass of the antioxidant were mixed with 100 parts by mass of polyurethane resin, followed by extrusion molding of the mixture using a twin-screw anisotropic extruder, to obtain a sheet-shaped member with a thickness of 0.8 mm. The refractive index of the light emitting layer was 1.47. Thereafter, a light emitting structure was obtained in the same manner as in Example 1.

Example 6

As shown in Table 2, two sheets of clear glass (with a thickness of 2.5 mm, a length of 300 mm, a width of 300 mm, and a visible light transmittance of 86%) were prepared as the first and second substrates, and a coating composed of an europium complex (a sheet-shaped member with a thickness of 10 nm) was formed on one surface of the second substrate (clear glass) by sputtering. The first and second substrates were fixed to a frame so that the surface of the second substrate on which the coating was formed was opposed to the first substrate at an interval of 10 mm (via an air layer), to obtain a sheet-shaped structure having the structure comprised of first substrate/air layer/sheet-shaped member (coating composed of europium complex)/second substrate, as shown in FIG. 2.

Example 7

Two sheets of clear glass (with a thickness of 2.5 mm, a length of 300 mm, a width of 300 mm, a visible light transmittance of 90%, and a refractive index of 1.52) were prepared as the first and second substrates.

Further, 0.05 parts by mass of the wavelength conversion material (1), 40 parts by mass of the plasticizer, and 0.2 parts by mass of the antioxidant were mixed with 100 parts by mass of polyvinyl butyral resin (PVB), followed by extrusion molding of the mixture by a twin-screw anisotropic extruder, and the mixture was thereafter stretched 1.1 times in the MD direction, to obtain a sheet-shaped member with a thickness of 0.72 mm. The sheet-shaped member was cut into a length of 300 mm and a width of 300 mm.

Thereafter, one clear glass, the sheet-shaped member (the light emitting layer), and the other clear glass were stacked in this order, followed by preheating in an oven at a temperature of 240° C. for 90 seconds, and were then temporarily pressure-bonded using a heating roll. The temporarily pressure-bonded mixture was pressure-bonded using an autoclave under conditions of 150° C. and a pressure of 1.2 MPa for 30 minutes, to obtain a sheet-shaped structure having a laminated structure comprised of first substrate/sheet-shaped member (light emitting layer)/second substrate. The maximum excitation wavelength and the maximum emission wavelength of the sheet-shaped structure were as shown in Table 1. The refractive index of the light emitting layer was 1.47.

The light emitting layer had both end faces expanding out in the TD direction on the side surfaces of the sheet-shaped structure, thereby forming projections (with a height of 20000 nm). An antireflection film (with a refractive index of 1.38) made of $MgF_2$ with a thickness of 100 nm was formed by sputtering on a side surface on which such a projection was formed, to obtain a light emitting structure comprised of the light emitting layer and the antireflection material, as shown in FIG. 4.

Example 8

The same procedure was performed in the same manner as in Example 1, except that an antireflection material was formed by pressure bonding of a film having a moth-eye structure (product name "MOSMITE" available from Mitsubishi Chemical Corporation), instead of providing the antireflection film made of $MgF_2$ in the part of the side surface of the sheet-shaped structure.

Example 9

The same procedure was performed in the same manner as in Example 8, except that 0.2 parts by mass of the wavelength conversion material (2) was used instead of 0.05 parts by mass of the wavelength conversion material (1), and a film having a moth-eye structure with a different pitch was used. The refractive index of the light emitting layer was 1.47.

Example 10

The same procedure was performed in the same manner as in Example 1, except that an antireflection film (with a refractive index of 1.46) composed of $SiO_2$ with a thickness of 100 nm was formed by sputtering, instead of providing the antireflection film composed of $MgF_2$ in the part of the side surface of the sheet-shaped structure.

Comparative Example 1

The same procedure was performed in the same manner as in Example 1, except that no antireflection film was formed in the sheet-shaped structure.

Tables 1 and 2 show the summary of the laminated structures of Examples and Comparative Example, and the evaluation results therefor.

TABLE 1

|  |  | Example 1 | Example 2 | Example 3 | Example 4 | Example 5 |
|---|---|---|---|---|---|---|
| First substrate | Type | Clear glass | Clear glass | Clear glass | Clear glass | Polycarbonate |
|  | Thickness | 2.5 mm | 2.5 mm | 2.5 mm | 2.5 mm | 2.5 mm |
| Second substrate | Type | Clear glass | Clear glass | Clear glass | Clear glass | Polycarbonate |
|  | Thickness | 2.5 mm | 2.5 mm | 2.5 mm | 2.5 mm | 2.5 mm |
| Sheet-shaped member | Type | Particle-containing light emitting layer | Particle-containing light emitting layer | Particle-containing light emitting layer | Particle-containing light emitting layer | Particle-containing light emitting layer |
|  | Resin | PVB | EVA | Thermoplastic elastomer | PVB | Polyurethane resin |
|  | Wavelength conversion material | Eu complex | Eu complex | Eu complex | $BaSnO_3$ | Eu complex |
| Sheet-shaped structure | Type | FIG. 1 | FIG. 1 | FIG. 1 | FIG. 1 | FIG. 1 |
|  | Maximum emission wavelength (nm) | 610 | 610 | 610 | 840 | 610 |
|  | Maximum excitation wavelength (nm) | 380 | 380 | 380 | 380 | 380 |
|  | Visible light transmittance (%) | 83 | 83 | 83 | 83 | 82 |
| Antireflection material | Type | $MgF_2$ coating | $MgF_2$ coating | $MgF_2$ coating | AR1.5-M1210 film | $MgF_2$ coating |
|  | Refractive index | 1.38 | 1.38 | 1.38 | — | 1.38 |
|  | Pitch between fine projections | — | — | — | — | — |
| Electric generating capacity per unit area |  | B | B | B | A | A |

TABLE 2

|  |  | Example 6 | Example 7 | Example 8 | Example 9 | Example 10 | Comparative Example 1 |
|---|---|---|---|---|---|---|---|
| First substrate | Type | Clear glass | Clear glass | Clear glass | Clear glass | Clear glass | Clear glass |
|  | Thickness | 2.5 mm | 2.5 mm | 2.5 mm | 2.5 mm | 2.5 mm | 2.5 mm |
| Second substrate | Type | Clear glass | Clear glass | Clear glass | Clear glass | Clear glass | Clear glass |
|  | Thickness | 2.5 mm | 2.5 mm | 2.5 mm | 2.5 mm | 2.5 mm | 2.5 mm |
| Sheet-shaped member | Type | Wavelength conversion material coating | Particle-containing light emitting layer | Particle-containing light emitting layer | Particle-containing light emitting layer | Particle-containing light emitting layer | Particle-containing light emitting layer |
|  | Resin | — | PVB | PVB | PVB | PVB | PVB |
|  | Wavelength conversion material | Eu complex | Eu complex | Eu complex | $BaSnO_3$ | Eu complex | Eu complex |
| Sheet-shaped structure | Type | FIG. 2 | FIG. 4 | FIG. 1 | FIG. 1 | FIG. 1 | — |
|  | Maximum emission wavelength (nm) | 610 | 610 | 610 | 840 | 610 | 610 |
|  | Maximum excitation wavelength (nm) | 380 | 380 | 380 | 380 | 380 | 380 |
|  | Visible light transmittance (%) | 83 | 83 | 83 | 83 | 83 | 83 |
| Antireflection material | Type | $MgF_2$ coating | $MgF_2$ coating | Moth-eye film | Moth-eye film | $SiO_2$ coating | None |
|  | Refractive index | 1.38 | 1.38 | — | — | 1.46 | None |
|  | Pitch between fine projections | — | — | 50 nm | 200 nm | — | — |
| Electric generating capacity per unit area |  | B | A | B | B | B− | — |

As shown in Tables 1 and 2, the electric generating capacity of the power generation cell disposed on the outer side of the side surface can be increased because, in each of Examples, the antireflection material is provided on the side surface of the sheet-shaped structure.

REFERENCE SIGNS LIST

10A: Light emitting layer (sheet-shaped member)
10B: Coating (sheet-shaped member)
10C: Recess
10D: Projection
11 and 12: Substrates (first and second substrates)
11A: One surface
11B: The other surface
13: Air layer
14: Antireflection material
14C: Projection
14D: Recess
14B: Outer side surface
15: Light emitting structure
17: Photovoltaic cell
20: Sheet-shaped structure
20A: Side surface

The invention claimed is:

1. A light emitting structure comprising:
a sheet-shaped structure which absorbs excitation light and emits light with wavelength conversion and which has a maximum emission wavelength of 400 nm or more; and
an antireflection material provided on a side surface of the sheet-shaped structure,
wherein a visible light transmittance of the antireflection material is 70% or more.

2. The light emitting structure according to claim 1, wherein the sheet-shaped structure comprises one or more layers, at least one of the layers is a substrate selected from the group consisting of an inorganic glass plate and a resin plate, and the substrate emits light, or a layer other than the substrate emits light.

3. The light emitting structure according to claim 1, wherein the sheet-shaped structure comprises:
a substrate that is any one of an inorganic glass and a resin plate; and
a sheet-shaped member provided on at least one surface side of the substrate, wherein the sheet-shaped member absorbs excitation light and emits light with wavelength conversion, and a maximum emission wavelength thereof is 400 nm or more.

4. The light emitting structure according to claim 3, wherein the sheet-shaped member is a light emitting layer comprising a resin and the wavelength conversion material dispersed in the resin.

5. The light emitting structure according to claim 3, wherein
the sheet-shaped member is composed of a coating formed on a surface of the substrate or is constituted by forming a coating on at least one surface of a base film, and
the coating comprises a wavelength conversion material.

6. The light emitting structure according to claim 3, wherein the sheet-shaped structure comprises two substrates, and the sheet-shaped member is disposed between the two substrates.

7. The light emitting structure according to claim 1, wherein a maximum emission wavelength emitted from the sheet-shaped structure is 780 to 1300 nm.

8. The light emitting structure according to claim 1, wherein a maximum excitation wavelength absorbed by the sheet-shaped structure is 400 nm or less.

9. The light emitting structure according to claim 1, wherein the antireflection material has a moth-eye structure.

10. A light emitting structure comprising:
a sheet-shaped structure which absorbs excitation light and emits light with wavelength conversion and which has a maximum emission wavelength of 400 nm or more; and
an antireflection material provided on a side surface of the sheet-shaped structure,
wherein the sheet-shaped structure comprises a substrate selected from the group consisting of an inorganic glass plate and a resin plate, and
the antireflection material is an antireflection film having a refractive index lower than the refractive index of the substrate.

11. A solar cell system comprising:
the light emitting structure according to claim 1; and
a power generation cell provided outside the antireflection material on the side surface of the light emitting structure.

* * * * *